United States Patent
Lee et al.

(10) Patent No.: US 9,788,409 B2
(45) Date of Patent: Oct. 10, 2017

(54) CIRCUIT BOARD AND METHOD OF MANUFACTURING THE SAME

(71) Applicant: SAMSUNG ELECTRO-MECHANICS CO., LTD., Suwon-si (KR)

(72) Inventors: Young-Kwan Lee, Changwon (KR); Yul-Kyo Chung, Yongin (KR); Seung-Eun Lee, Seongnam (KR); Ki-Jung Sung, Seoul (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/990,464

(22) Filed: Jan. 7, 2016

(65) Prior Publication Data

US 2016/0302299 A1  Oct. 13, 2016

(30) Foreign Application Priority Data

Apr. 8, 2015 (KR) .................. 10-2015-0049579

(51) Int. Cl.
*H05K 1/00* (2006.01)
*H05K 1/02* (2006.01)
*H05K 1/18* (2006.01)
*H05K 3/42* (2006.01)

(52) U.S. Cl.
CPC ......... *H05K 1/0206* (2013.01); *H05K 1/0298* (2013.01); *H05K 1/181* (2013.01); *H05K 3/42* (2013.01)

(58) Field of Classification Search
CPC ........ H05K 1/182; H05K 1/183; H05K 1/206; H05K 3/4602; H05K 1/0298; H05K 1/181; H05K 3/42
USPC ........................................... 174/252; 252/252
See application file for complete search history.

(56) References Cited

U.S. PATENT DOCUMENTS

| | | | | |
|---|---|---|---|---|
| 6,205,028 | B1* | 3/2001 | Matsumura | H05K 1/0201 174/252 |
| 6,332,782 | B1* | 12/2001 | Bezama | H05K 1/141 439/66 |
| 2006/0081396 | A1* | 4/2006 | Hsu | H05K 1/115 174/255 |
| 2006/0191711 | A1* | 8/2006 | Cho | H01L 23/5389 174/260 |
| 2014/0041907 | A1* | 2/2014 | Kim | H05K 1/0204 174/252 |

FOREIGN PATENT DOCUMENTS

JP  3684830 B2  6/2005
JP  4187352 B2  11/2008

* cited by examiner

*Primary Examiner* — Steven T Sawyer
(74) *Attorney, Agent, or Firm* — NSIP Law

(57) ABSTRACT

A circuit board includes an insulating material; and a heat-transfer structure comprising a plurality of heat-dissipating members and inserted in the insulating material, wherein the plurality of heat-dissipating members each includes a metal wire; and an insulating part disposed on an outer circumferential surface of the metal wire excluding a top surface and a bottom surface of the metal wire.

7 Claims, 4 Drawing Sheets

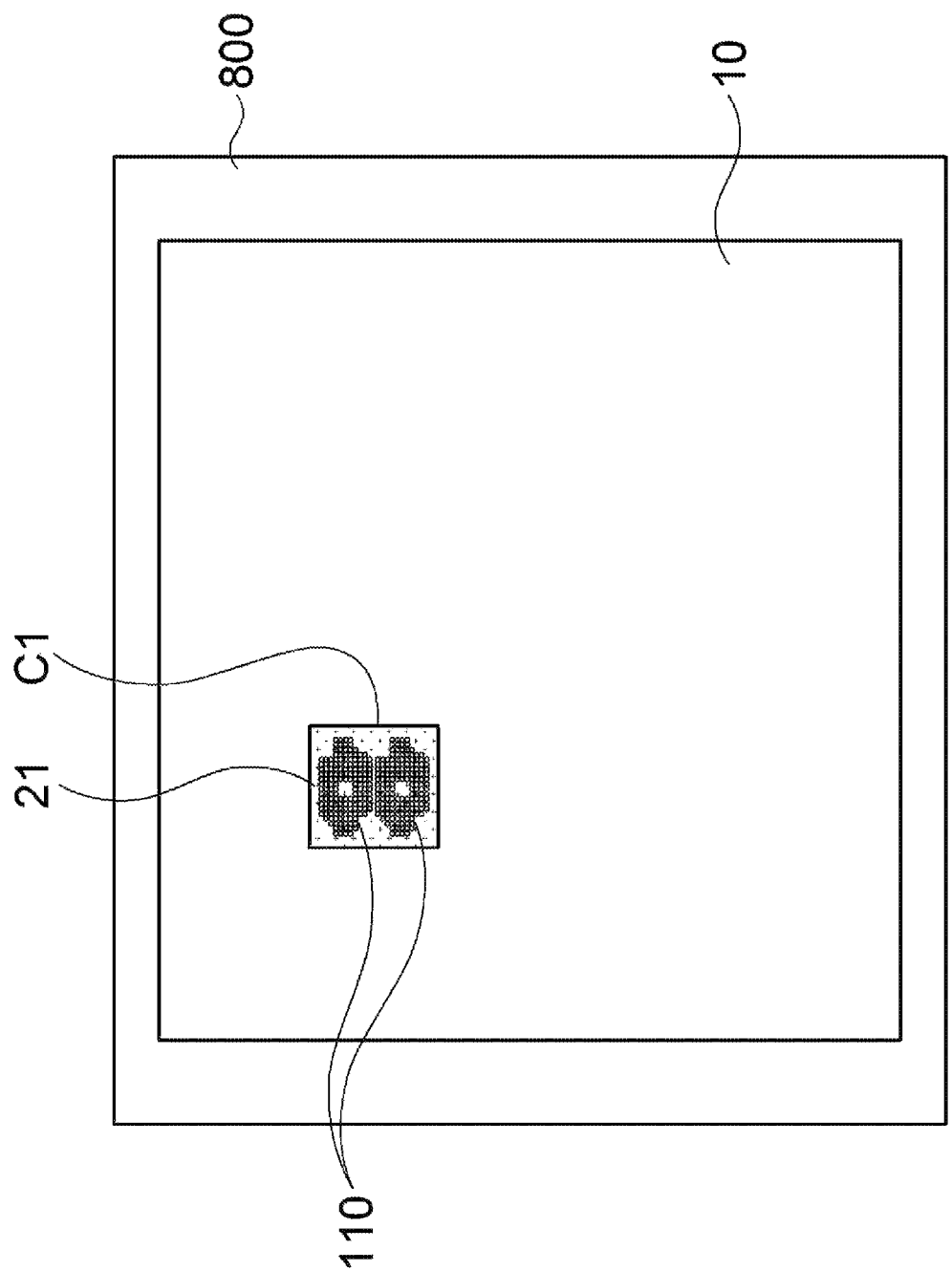

CIRCUIT BOARD AND METHOD OF MANUFACTURING THE SAME

CROSS-REFERENCE TO RELATED APPLICATIONS

This application claims the benefit under 35 USC 119(a) of Korean Patent Application No. 10-2015-0049579, filed in the Korean Intellectual Property Office on Apr. 8, 2015, the entire disclosure of which is incorporated herein by reference for all purposes.

BACKGROUND

1. Field

The following description relates to a circuit board and a method of manufacturing the same.

2. Description of Related Art

To address today's electronic devices that are increasingly lighter, smaller and faster and have more functions and higher performances, various multilayered board technologies have been developed by forming a plurality of wiring layers on a circuit board, such as a printed circuit board (PCB). Some of these technologies have evolved to install electronic components, such as active devices or passive devices, in the multilayered board. An increased amount of heat is generated as application processors (AP), connected to the multilayered board, have more functions and greater performance.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a circuit board having an improved heat-dissipating performance, a lighter, thinner and smaller board, an improved reliability, a reduced noise and an improved manufacturing efficiency. The circuit board includes an insulating material; and a heat-transfer structure comprising a plurality of heat-dissipating members and inserted in the insulating material, wherein the plurality of heat-dissipating members each includes a metal wire; and an insulating part disposed on an outer circumferential surface of the metal wire excluding a top surface and a bottom surface of the metal wire.

In another general aspect, the circuit board includes an insulating material; and a heat-transfer structure inserted in the insulating material, wherein the heat-transfer structure includes a first heat-dissipating member comprising a first insulating part disposed on an outer surface of a first metal wire; and a second heat-dissipating member comprising a second insulating part disposed on an outer surface of a second metal wire.

By forming the heat-transfer structure by arranging the heat-dissipating tubes in parallel, top surfaces and bottom surfaces of the heat-dissipating tubes may be exposed, respectively, through a top surface and a bottom surface of the heat-transfer structure. Heat may be transferred from the bottom surface to the top surface of the heat-transfer structure, or vice versa, through the metal wires constituting the heat-dissipating tubes. A signal path through a group of heat-dissipating tubes may be insulated from another signal path through a different group of heat-dissipating tubes.

In another general aspect, a method of manufacturing a circuit board, includes forming a heat-transfer structure by coupling a plurality of heat-dissipating members with one another, the heat-dissipating members each comprising an insulating part disposed on an outer circumferential surface of a metal wire; inserting the heat-transfer structure into a cavity disposed in a first insulating layer; forming a second insulating layer covering the first insulating layer and the heat-transfer structure; and forming a via, penetrating the second insulating layer, in contact with the heat-transfer structure.

Other features and aspects will be apparent from the following detailed description, the drawings, and the claims.

BRIEF DESCRIPTION OF DRAWINGS

FIG. 4 is a horizontal-sectional view illustrating the circuit board of FIG. 1.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
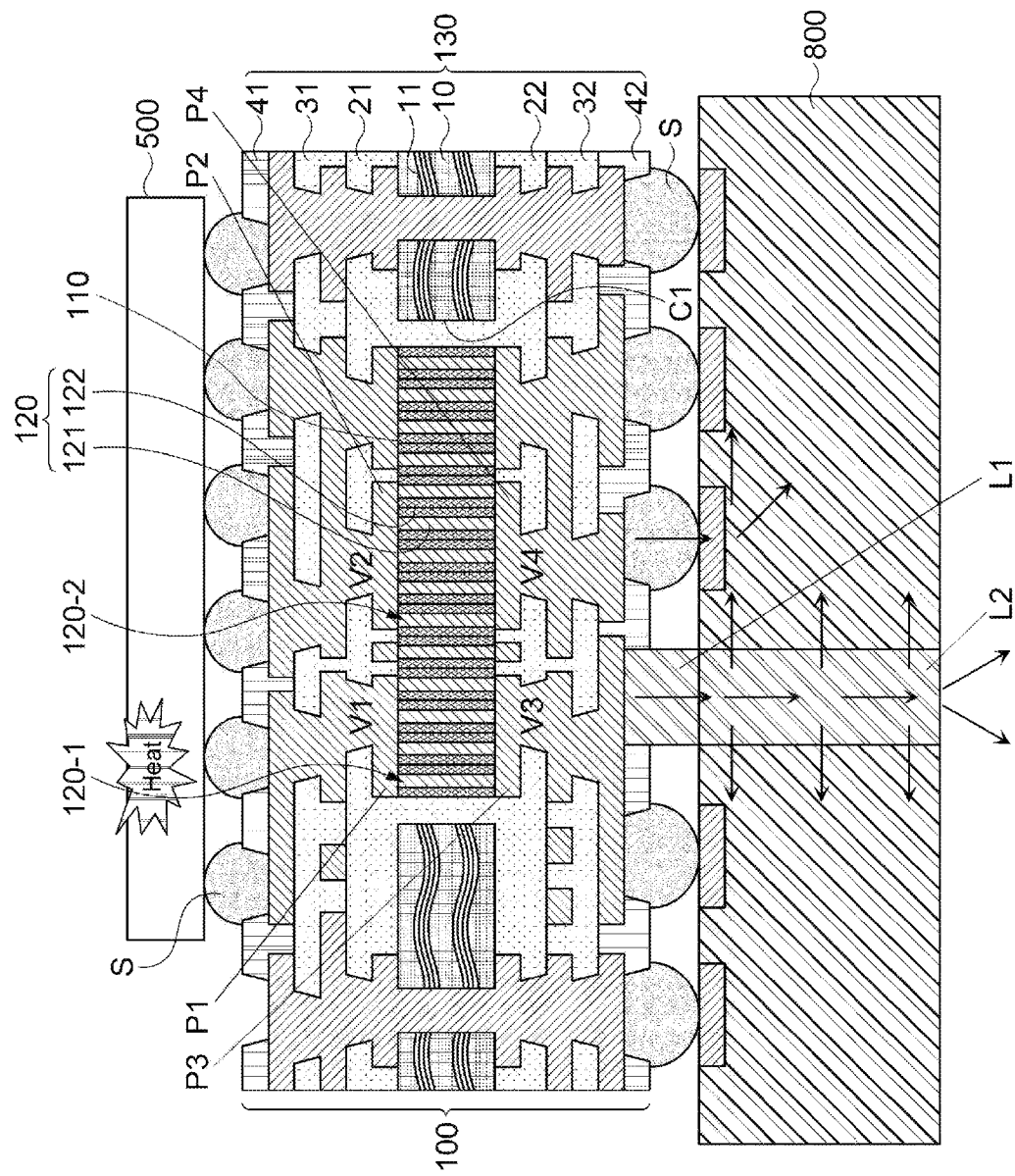
FIG. 1 is a cross-sectional view illustrating a circuit board in accordance with an embodiment.
Figure 2:
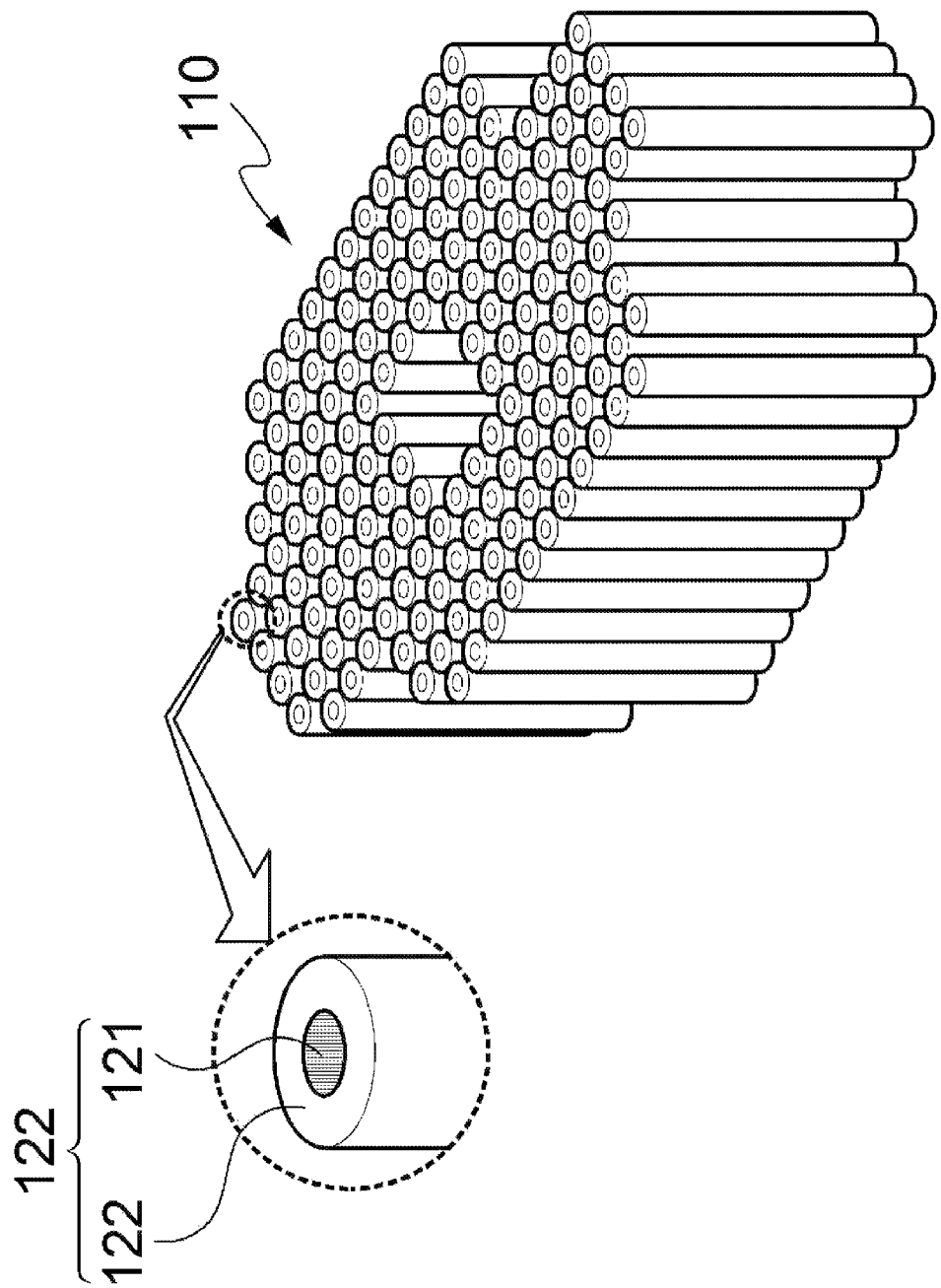
FIG. 2 illustrates an example of a heat-transfer structure of the circuit board of FIG. 1.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Terms such as "first" and "second" are used to merely distinguishing one element from other identical or corresponding elements, but the above elements shall not be restricted to the above terms.

Unless indicated otherwise, a statement that a first layer is "on" a second layer or a substrate is to be interpreted as covering both a case where the first layer directly contacts the second layer or the substrate, and a case where one or more other layers are disposed between the first layer and the second layer or the substrate.

Words describing relative spatial relationships, such as "below", "beneath", "under", "lower", "bottom", "above", "over", "upper", "top", "left", and "right", may be used to conveniently describe spatial relationships of one device or elements with other devices or elements. Such words are to be interpreted as encompassing a device oriented as illustrated in the drawings, and in other orientations in use or operation. For example, an example in which a device includes a second layer disposed above a first layer based on the orientation of the device illustrated in the drawings also encompasses the device when the device is flipped upside down in use or operation.

Referring to FIG. 1, a circuit board 100 includes a heat-transfer structure 110, which is inserted at least partially in an insulating material 130. The heat-transfer structure 110 includes heat-dissipating tubes, or members, 120, each of which comprises a metal wire 121 and an insulating part 122. In this example, the insulating part 122 is disposed on an outer circumferential surface of the metal wire 121 excluding a top surface and a bottom surface of the metal wire 121, and functions to provide insulation from at least an adjacent heat-dissipating tube 120. The metal wire 121 is made of a material having a high thermal conductivity, for example copper.

The heat-dissipating tubes 120 are arranged in parallel to create the heat-transfer structure 110. Additionally, adjacent heat-dissipating tubes 120 are coupled with one another in such a manner that the insulating parts 122 are in contact with one another. Moreover, the top surfaces of the metal wires 121 are exposed through a top surface of the heat-transfer structure 110, and the bottom surfaces of the metal wires 121 are exposed through a bottom surface of the heat-transfer structure 110.

Accordingly, not only can the metal wires 121 of the heat-dissipating tubes 120 of the heat-transfer structure 110 perform a heat-transferring function, but insulation can be provided between the metal wires 121, and thus it is possible to create a plurality of signal routes that pass through the heat-transfer structure 110 and are insulated from one another. Moreover, it is possible to efficiently manufacture various shapes of heat-transfer structures by use of the heat-dissipating tubes 120, providing an improved design freedom for circuit wiring.

The insulating material 130 comprises a single insulating layer or a plurality of insulating layers. In other words, the insulating material described herein collectively refers to a first insulating layer 10, second insulating layers 21, 22, third insulating layers 31, 32 and fourth insulating layers 41, 42, as illustrated in FIG. 1. Although FIG. 1 shows that the insulating material 130 comprises the first insulating layer 10, the second insulating layers 21, 22, the third insulating layers 31, 32 and the fourth insulating layers 41, 42, the number of insulating layers may be varied. The first insulating layer 10 functions as a core of the circuit board 100 and contains a core material 11, such as glass fiber, in order to reinforce its function.

The heat-transfer structure 110 is placed in a middle of the insulating material 130. In the case where the first insulating layer 10 is disposed as illustrated, a cavity C1 is formed to penetrate the first insulating layer 10, and the heat-transfer structure 110 is inserted in the cavity C1. In this example, although it is illustrated in FIG. 4 that the cavity C1 is formed in a rectangular shape, the heat-transfer structure 110 may be formed in a variety of shapes, as described earlier, and the cavity C1 may be formed in various shapes corresponding to the shape of the heat-transfer structure 110 as long as the heat-transfer structure 110 can be inserted therein.

Vias formed in the insulating material 130 may be in contact with the heat-transfer structure 110. Hereinafter, the vias formed above the heat-transfer structure 110 and insulated from each other are referred to as a first via V1 and a second via V2, and the vias formed below the heat-transfer structure 110 and insulated from each other are referred to as a third via V3 and a fourth via V4. Although the first through fourth vias V1-V4 are in direct contact with the heat-transfer structure 110, it is also possible that circuit patterns are formed on surfaces of the heat-transfer structure 110 and the first to fourth vias V1-V4 are in contact, respectively, with the circuit patterns. Hereinafter, the circuit patterns of which one surface is in contact with the surface of the heat-transfer structure 110 and the other surface is in contact with one of the first to fourth vias V1-V4 are referred to, respectively, as a first circuit pattern P1, a second circuit pattern P3, a third circuit pattern P3 and a fourth circuit pattern P4.

The first via V1 and the second via V2 are in contact with different heat-dissipating tubes 120 from each other, and the third via V3 and the fourth via V4 are in contact with different heat-dissipating tubes 120 from each other. Accordingly, a signal path through the first via V1 and a signal path through the second via V2 are insulated from each other, and thus a plurality of electric signals passing through the heat-transfer structure 110 is transferred independently from each other. For instance, in the case where the first via V1 and the third via V3 communicate through a first heat-dissipating tube 120-1 and the second via V2 and the fourth via V4 communicate through a second heat-dissipating tube 120-2, a signal path through the first via V1, the first heat-dissipating tube 120-1 and the third via V3, and a signal path through the second via V2, the second heat-dissipating tube 120-2 and the fourth via V4 are insulated from each other and thus are independently utilized for signal transfer.

A plurality of independent signal paths are also possible through a similar principle described above in the case where the first through fourth circuit patterns P1-P4 are interposed, respectively, between the first to fourth vias V1-V4 and the heat-transfer structure 110.

The heat-transfer structure 110 carries out a function of storing heat, and the function of storing the heat is enhanced as a volume of the heat-transfer structure 110 is increased. Accordingly, as illustrated, the heat-transfer structure 110 is formed in a column shape. As the heat-transfer structure 110 is formed in a column shape, it is possible to maximize the volume of the heat-transfer structure 110 for a given area of the bottom surface. Accordingly, the heat-transfer structure 110 quickly absorbs the heat from a heat source and disperses the absorbed heat through a different path connected with the heat-transfer structure 110. Moreover, by increasing a thickness of the heat-transfer structure 110, a distance between the heat-transfer structure 110 and a hot spot may be reduced, shortening a time required for the heat of the hot sport to transfer to the heat-transfer structure 110. Moreover, since the heat-transfer structure 110 of the circuit board 100 is comprised of the plurality of heat-dissipating tubes 120 coupled in parallel, the top surface and the bottom surface of the heat-transfer structure 110 may be formed in a variety of shapes. That is, the heat-transfer structure 110 may be manufactured to have optimal shapes of the top and bottom surfaces that are efficient for a circuit pattern or warpage characteristics. Accordingly, a sufficient heat-dissipating performance may be obtained while realizing the required circuit pattern in a narrower space.

A first electronic component 500 is installed on one side of the circuit board 100. Moreover, the circuit board 100 is installed on one side of a supplemental board 800, such as a mainboard. In this example, the first electronic component 500 may be an application processor (AP) and generates heat during operation.

The heat generated due to the operation of the first electronic component 500 is measured to be relatively higher at a certain portion of the first electronic component 500. Such a portion is often referred to as a "hot spot." The hot spot may be throughout the first electronic component 500 or localized near a particular portion of the first electronic component 500, for example, near a power source terminal of the first electronic component 500 or at an area of the first electronic component 500 where switching devices are relatively heavily concentrated.

Figure 3:
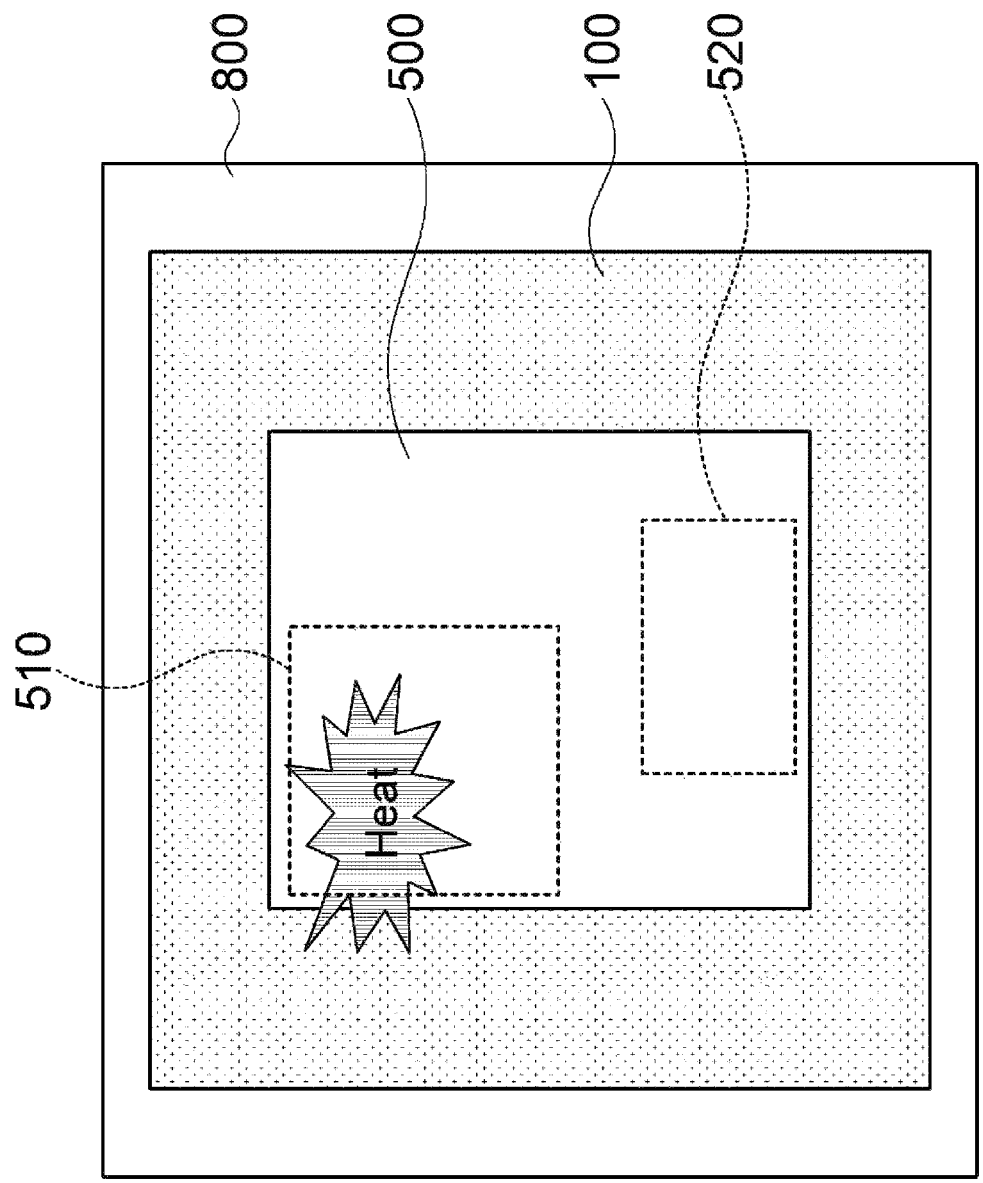
FIG. 3 is a top view of the circuit board of FIG. 1.

In another example, the first electronic component 500 may include a region that has a relatively higher performance specification and a region that has a relatively lower performance specification. For instance, the first electronic component 500 may comprise a processor connected with cores having the clock speed of 1.8 GHz in one region thereof and a processor connected with cores having the clock speed of 1.2 GHz in another region thereof. Referring to the embodiment of FIG. 3, the first electronic component 500 includes a first unit region 510 and a second unit region 520. In this example, the first unit region 510 performs a faster operation than the second unit region 520 and accordingly consumes a greater amount of electric power and generates a greater amount of heat than the second unit region 520.

The circuit board 100 has the heat-transfer structure 110 disposed at an area adjacent to the hot spot. Accordingly, the heat generated from the hot spot is quickly transferred to the heat-transfer structure 110 and quickly dispersed to other regions of the circuit board 100 or to another device such as the mainboard to which the circuit board is coupled.

At least a portion of the heat-transfer structure 110 is disposed on an area vertically below the first electronic component 500. In this example, most of the heat-transfer structure 110 is disposed on the area vertically below the first electronic component 500. Moreover, the top surface of the heat-transfer structure 110 has a smaller area than that of a top surface of the first electronic component 500. Furthermore, the area of the top surface of the heat-transfer structure 110 is determined to correspond to a width of the hot spot of the first electronic component 500. Accordingly, the heat of the hot spot is rapidly transferred to the heat-transfer structure 110. Therefore, not only is it advantageous for making the circuit board 100 lighter and minimizing a warpage, but also the heat-transfer structure 110 is disposed in the circuit board 100 to more efficiently transfer heat.

The first electronic component 500 is coupled thermally and/or electrically with the circuit board 100 by a solder S. Moreover, the circuit board 100 is connected to the supplemental board 800, such as a mainboard, by way of the solder S. In this example, a second heat-transfer structure L1, which has a higher heat transfer performance than the general solder S, is disposed on a heat-transfer path adjacent to the heat-transfer structure 110. That is, for efficient transfer of the heat from the heat-transfer structure 110 to the supplemental board 800, the circuit board 100 and the supplemental board 800 are connected with each other using the second heat-transfer structure L1 formed in a lump shape with a material having a greater thermal conductivity than the general solder S. Moreover, a heat-dissipating part L2 is disposed in the supplemental board 800 for efficient dispersion or dissipation of the heat from the second heat-transfer structure L1. The heat-dissipating part L2 is exposed toward a top surface of the supplemental board 800 and is also exposed toward a bottom surface of the supplemental board 800, if necessary, to improve an efficiency of heat dissipation. Accordingly, the heat generated from the hot spot is quickly transferred to the supplemental board 800 through the heat-transfer structure 110.

The fourth insulating layers 41, 42 are each a solder resist layer. That is, the fourth insulating layers 41, 42 carry out a function of exposing portions of a metal pattern and protecting other portions of the metal pattern and the insulating material 130 at the same time. Moreover, any one of various surface-treated layers, such as, for example, a Ni-Au plated layer, may be disposed on a surface of the metal patterns exposed out of the solder resist layer.

As a non-exhaustive example only, an electronic device as described herein may be a mobile device, such as a cellular phone, a smart phone, a wearable smart device (such as a ring, a watch, a pair of glasses, a bracelet, an ankle bracelet, a belt, a necklace, an earring, a headband, a helmet, or a device embedded in clothing), a portable personal computer (PC) (such as a laptop, a notebook, a subnotebook, a netbook, or an ultra-mobile PC (UMPC), a tablet PC (tablet), a phablet, a personal digital assistant (PDA), a digital camera, a portable game console, an MP3 player, a portable/personal multimedia player (PMP), a handheld e-book, a global positioning system (GPS) navigation device, or a sensor, or a stationary device, such as a desktop PC, a high-definition television (HDTV), a DVD player, a Blu-ray player, a set-top box, or a home appliance, or any other mobile or stationary device capable of wireless or network communication. In one example, a wearable device is a device that is designed to be mountable directly on the body of the user, such as a pair of glasses or a bracelet. In another example, a wearable device is any device that is mounted on the body of the user using an attaching device, such as a smart phone or a tablet attached to the arm of a user using an armband, or hung around the neck of the user using a lanyard.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A circuit board comprising: an insulating material having a cavity formed therein; a heat-transfer structure comprising a plurality of heat-dissipating members and inserted in the cavity of the insulating material; a first circuit pattern and a second circuit pattern formed on a top surface of the heat-transfer structure; and a third circuit pattern and a fourth circuit pattern formed on a bottom surface of the heat-transfer structure, wherein the plurality of heat-dissipating members each comprise: a metal wire; and an insulating member coated on an outer circumferential surface of the metal wire excluding a top surface and a bottom surface of the metal wire, wherein the heat-transfer structure is formed by disposing the plurality of heat-dissipating members in such a way that the insulating member of one of the plurality of heat-dissipating members is in contact with the insulating member of another of the plurality of heat-dissipating members that is adjacent to the one of the plurality of heat-dissipating members, wherein a bottom surface of the first circuit pattern is in contact with a top surface of one of a plurality of metal wires, wherein a bottom surface of the second circuit pattern is in contact with a top surface of another of the plurality of metal wires, wherein a top surface of the third circuit pattern is in contact with a bottom surface of one of the plurality of metal wires, and wherein a top surface of the fourth circuit pattern is in contact with a bottom surface of another of the plurality of metal wires.

2. The circuit board as set forth in claim 1, the metal wire of at least one of the plurality of heat-dissipating members has a top surface and a bottom surface thereof exposed through a top surface and a bottom surface of the heat-transfer structure, respectively.

3. The circuit board as set forth in claim 1, further comprising:
   a first via comprising a bottom surface thereof in contact with a top surface of the first circuit pattern;
   a second via comprising a bottom surface thereof in contact with a top surface of the second circuit pattern;
   a third via comprising a top surface thereof in contact with a bottom surface of the third circuit pattern; and
   a fourth via comprising a top surface thereof in contact with a bottom surface of the fourth circuit pattern,
   wherein the first via is electrically connected to the third via, and the second via is electrically connected to the fourth via.

4. A circuit board comprising: an insulating material; and a heat-transfer structure inserted in the insulating material, wherein the heat-transfer structure comprises: a first heat-dissipating member comprising a first insulating member coated on an outer surface of a first metal wire excluding a top surface and a bottom surface of the first metal wire; and a second heat-dissipating member comprising a second insulating member coated on an outer surface of a second metal wire excluding a top surface and a bottom surface of the second metal wire and in contact with the first insulating member, wherein the circuit board further comprises: a first circuit pattern comprising a bottom surface thereof in contact with a top surface of the first metal wire; a second circuit pattern comprising a bottom surface thereof in contact with a top surface of the second metal wire; a third circuit pattern comprising a top surface thereof in contact with a bottom surface of the first metal wire; and a fourth circuit pattern comprising a top surface thereof in contact with a bottom surface of the second metal wire.

5. The circuit board as set forth in claim 4, further comprising:
   a first via comprising a bottom surface thereof in contact with a top surface of the first circuit pattern;
   a second via comprising a bottom surface thereof in contact with a top surface of the second circuit pattern;
   a third via comprising a top surface thereof in contact with a bottom surface of the third circuit pattern; and
   a fourth via comprising a top surface thereof in contact with a bottom surface of the fourth circuit pattern.

6. The circuit board as set forth in claim 4, further comprising: a second heat-transfer structure disposed on the circuit board, thermally connected to the heat-transfer structure.

7. The circuit board as set forth in claim 6, further comprising an electronic component configured to generate heat during operation, wherein the heat-transfer structure is configured to transfer heat away from the electronic component to the second heat-transfer structure through a plurality of vias.

* * * * *